United States Patent
Loup et al.

(10) Patent No.: US 9,831,095 B2
(45) Date of Patent: Nov. 28, 2017

(54) METHOD FOR PERFORMING SELECTIVE ETCHING OF A SEMICONDUCTOR MATERIAL IN SOLUTION

(71) Applicant: COMMISSARIAT À L'ENERGIE ATOMIQUE ET AUX ENERGEIS ALTERNATIVES, Paris (FR)

(72) Inventors: Virginie Loup, Saint-Engrève (FR); Pascal Besson, Notre-Dame-de-Mésage (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/361,193

(22) Filed: Nov. 25, 2016

(65) Prior Publication Data
US 2017/0148638 A1 May 25, 2017

(30) Foreign Application Priority Data
Nov. 25, 2015 (FR) ...................... 15 61385

(51) Int. Cl.
| H01L 21/311 | (2006.01) |
| H01L 21/306 | (2006.01) |
| H01L 21/02 | (2006.01) |
| H01L 29/04 | (2006.01) |

(52) U.S. Cl.
CPC .. *H01L 21/30604* (2013.01); *H01L 21/02236* (2013.01); *H01L 29/04* (2013.01)

(58) Field of Classification Search
USPC ....................................................... 438/694
See application file for complete search history.

(56) References Cited

U.S. PATENT DOCUMENTS

| 2005/0148147 A1 | 7/2005 | Keating et al. |
| 2008/0111175 A1 | 5/2008 | Cheng et al. |
| 2015/0214099 A1* | 7/2015 | Grenouillet ....... H01L 21/76283 438/424 |

FOREIGN PATENT DOCUMENTS

| WO | 2013/143035 A1 | 10/2013 |
| WO | 2014/112430 A1 | 7/2014 |

OTHER PUBLICATIONS

Chen et al, The characteristic behavior of TMAH water solution for anisotropic etching on both Silicon substrate and SiO2 layer, "Sensors and Actuators A," pp. 132-137, (2001).

* cited by examiner

*Primary Examiner* — Roberts Culbert
(74) *Attorney, Agent, or Firm* — Oliff PLC

(57) ABSTRACT

A method for performing selective etching of a semiconductor material in solution having the following successive steps: a) providing a substrate having a layer of amorphous semiconductor material to be etched and a layer of crystalline semiconductor material; b) oxidizing the surfaces of the layers of amorphous semiconductor material and of crystalline semiconductor material so as to form a first protective layer at the surface of the amorphous semiconductor material and a second protective layer at the surface of the crystalline semiconductor material; c) etching the first protective layer and the layer of amorphous semiconductor material with an alkaline etching solution, the etch rate $v_1$ of the first protective layer being higher than the etch rate $v_2$ of the second protective layer.

23 Claims, 4 Drawing Sheets

METHOD FOR PERFORMING SELECTIVE ETCHING OF A SEMICONDUCTOR MATERIAL IN SOLUTION

BACKGROUND OF THE INVENTION

The invention relates to a method for performing selective etching of a semiconductor material in solution.

STATE OF THE ART

An increasingly large number of methods for fabricating semiconductor-based electronic devices involve steps in which amorphous silicon has to be selectively etched on a substrate which comprises both amorphous silicon and crystalline silicon.

Certain chemical solutions are known to enable selective etching of the layers of amorphous silicon with selectivity factors comprised between 2 and 5, i.e. the etching kinetics of the amorphous silicon are a maximum of 5 times faster than what can be obtained on crystalline silicon (FIGS. 1a to 1d). The etching solutions used are for example mixtures with a base formed by: water, ammonia, hydrogen peroxide, (FIG. 1a); acetic acid, hydrofluoric acid, hydrogen peroxide (FIG. 1b); water, sulphuric acid, hydrofluoric acid, hydrogen peroxide (FIG. 1c); tetramethylammonium hydroxide (FIG. 1d).

However, not only does a selectivity of 5 remain insufficient, but in addition these etchings are also generally accompanied by an increase of the roughness of the surfaces.

Other approaches than etching in chemical solutions are possible. These etching methods can present a better selectivity, but they result in impairment of the components, which reduces the performances of the devices and/or requires subsequent polishing steps.

OBJECT OF THE INVENTION

The object of the invention is to remedy the shortcomings of the prior art, and in particular to propose a method for performing selective etching of an amorphous semiconductor material with respect to a crystalline semiconductor material, the method presenting a high degree of selectivity.

This object is achieved by a method for performing selective etching of a semiconductor material in solution comprising the following successive steps:
  providing a substrate comprising a layer of amorphous semiconductor material to be etched and a layer of crystalline semiconductor material,
  oxidising the surfaces of the layers of amorphous semiconductor material and of crystalline semiconductor material so as to form a first protective layer at the surface of the amorphous semiconductor material and a second protective layer at the surface of the crystalline semiconductor material,
  etching the first protective layer and the layer of amorphous semiconductor material with an alkaline etching solution, the etch rate $v_1$ of the first protective layer being higher than the etch rate $v_2$ of the second protective layer.

Advantageously, the chemical etch time is adjusted so as to totally etch the amorphous semiconductor material layer without etching the crystalline semiconductor material layer.

Advantageously, the surfaces of the amorphous semiconductor material and crystalline semiconductor material layers are oxidised by a chemical process in a solution containing an oxidant of the semiconductor material.

Advantageously, etching is performed in a solution of TMAH or TEAH.

Advantageously, the semiconductor material is silicon.

BRIEF DESCRIPTION OF THE DRAWINGS

Other advantages and features will become more clearly apparent from the following description of particular embodiments of the invention given for non-restrictive example purposes only and represented in the appended drawings, in which:

FIG. 1a) water, ammonia, hydrogen peroxide; FIG. 1b) acetic acid, hydrofluoric acid, hydrogen peroxide; FIG. 1c) water, sulphuric acid, hydrofluoric acid, hydrogen peroxide; FIG. 1d) tetramethylammonium hydroxide.

DESCRIPTION OF A PREFERRED EMBODIMENT OF THE INVENTION

The method for performing selective etching of a layer of amorphous semiconductor material with respect to a layer of crystalline semiconductor material is an etching method in solution. What is meant hereinafter by crystalline is monocrystalline or polycrystalline.

What is meant by selective etching of a layer of amorphous semiconductor material with respect to a layer of crystalline semiconductor material is that, on completion of the etching step, the layer of crystalline semiconductor material is not etched, whereas the layer of amorphous semiconductor material is completely etched.

Figure 1A:
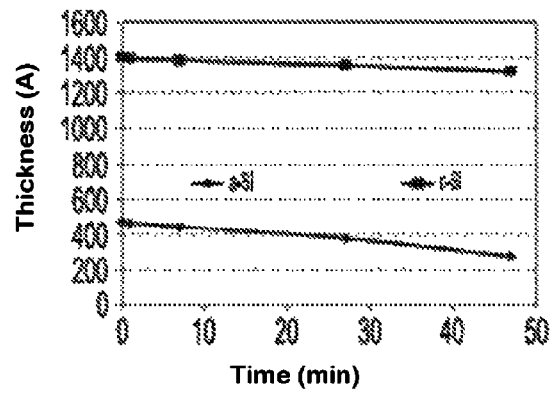
FIGS. 1a to 1d represent graphs giving the thickness of etched silicon versus time for different etching solutions.
Figure 1B:
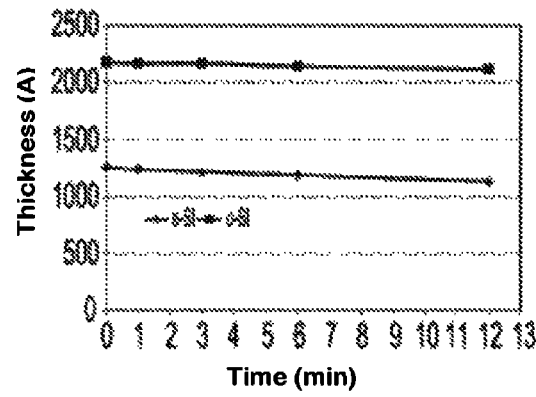
Figure 1C:
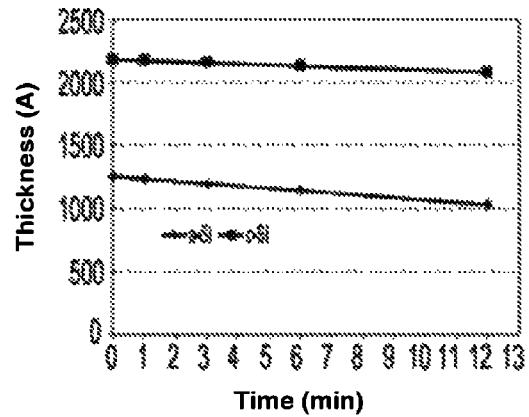
Figure 1D:
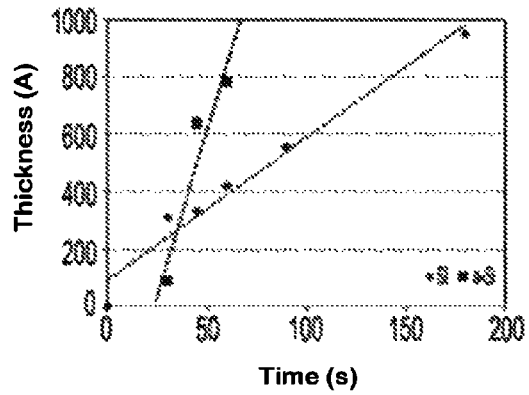
Figure 2A:
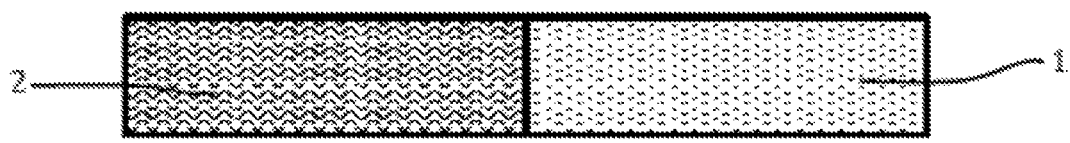
FIGS. 2a to 2e represent, schematically and in cross-section section, the different steps of a selective etching method of an amorphous semiconductor material layer with respect to a crystalline semiconductor material layer.
Figure 2B:
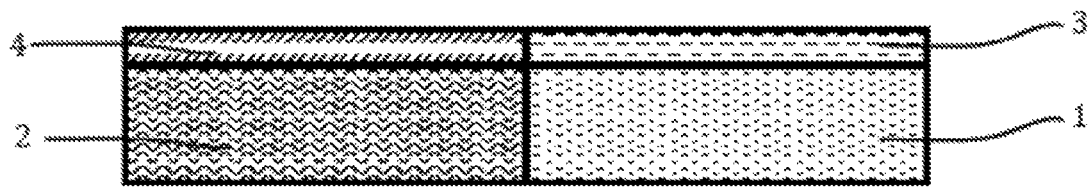
Figure 2C:
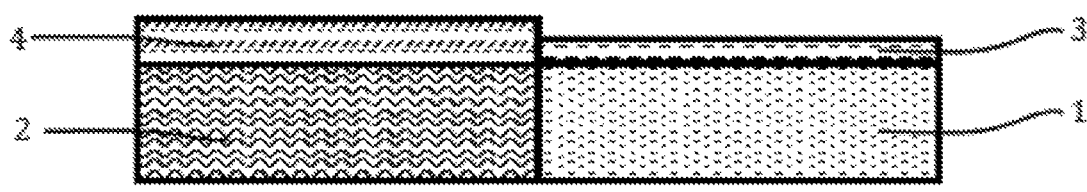

The method comprises the following successive steps (FIGS. 2a to 2e):
  a) providing a substrate comprising a layer of amorphous semiconductor material 1 to be etched and a layer of crystalline semiconductor material 2 (FIG. 2a),
  b) oxidising the surfaces of the layers of amorphous semiconductor material 1 and of crystalline semiconductor material 2 (FIG. 2b) so as to form a first protective layer 3 at the surface of the amorphous semiconductor material 1 and a second protective layer 4 at the surface of the crystalline semiconductor material 2, c) etching first protective layer 3 and amorphous semiconductor material layer 1 with an etching solution (FIGS. 2c to 2e), the etch rate $v_1$ of first protective layer 3 being higher than the etch rate $v_2$ of second protective layer 4: $v_1 > v_2$.

Preferentially, the etch time is adjusted so as to totally etch the amorphous semiconductor material layer 1 without etching crystalline semiconductor material layer 2.

Advantageously, as crystalline semiconductor material layer 2 is not etched, it has kept its initial thickness. The roughness of crystalline semiconductor material layer 2 is kept, and does not increase due to etching.

At the end of the etching step, crystalline semiconductor material layer 2 is protected by protective layer 4. Protective layer 4 can be partially etched.

Weak etching of the crystalline material can take place at the level of the edges, the sides of the crystalline semiconductor material layer, despite the presence of protective layer 4. However, such an etching remains negligible.

According to another alternative, it would be possible to envisage for only a part of crystalline semiconductor material layer 2 to be etched.

However, for numerous applications, and in order not to impair the roughness of the crystalline silicon layer, it is preferable for the crystalline semiconductor material layer not to be etched at all.

To obtain a substrate as provided in step a), i.e. a substrate comprising an amorphous semiconductor material layer 1 and a crystalline semiconductor material layer, several embodiments are possible.

In a first embodiment, an amorphous semiconductor material layer is deposited on the substrate. This layer is then partially crystallised so as to form an amorphous area and a crystallised area.

According to another embodiment, it is possible to deposit a crystalline semiconductor material layer on the substrate and to partially destructure it so as to form a part made from amorphous semiconductor material. Destructuring can be performed for example by ion bombardment.

Other alternatives will be able to be envisaged by the person skilled in the art.

In FIGS. 2a to 2e, amorphous semiconductor material layer 1 and crystalline semiconductor material layer 2 are represented at the same level to highlight the different etch rates $v_1$ and $v_2$. In reality, the topography of the layers can be different: the layers can be at different levels and/or present different thicknesses.

The semiconductor material is preferentially silicon or a SiGe alloy.

According to another embodiment, the material is a III-V material such as GaN.

The semiconductor material can be intrinsic or doped, with boron or phosphorus for example.

The amorphous semiconductor material and crystalline semiconductor material can both be doped. According to another alternative, only one of the two materials is doped. According to the third alternative, both the materials are intrinsic.

The semiconductor material of the amorphous layer and the semiconductor material of the crystalline layer are advantageously the same, i.e., in the case of silicon, the amorphous semiconductor material is amorphous silicon and the crystalline semiconductor material is crystalline silicon.

The crystalline semiconductor material can be monocrystalline or polycrystalline. What is meant by monocrystalline material is a material formed by a single grain, i.e. by a single area of the same crystallographic orientation.

What is meant by polycrystalline material is a material formed by several grains, the crystalline orientation of each grain being able to be different. The grains are separated by grain boundaries.

The substrate is for example a wafer integrating amorphous semiconductor material areas and monocrystalline or polycrystalline semiconductor material areas.

Preferentially, the crystalline semiconductor material is monocrystalline.

In step b), the surfaces of amorphous semiconductor material layer 1 and crystalline semiconductor material layer 2 are oxidized to form protective layers 3, 4. This step is the pre-treatment step. The protective layers are chemical oxide layers.

The oxide layer formed on the amorphous material layer will therefore have a different nature and/or structure from the oxide layer formed on the crystalline material layer. The etch rates of these layers will therefore be different. Depending on the materials chosen, it is also possible for the thicknesses of the oxide layers to be different.

Oxidation of the layers is performed in deliberate and controlled manner in an oxidation step, also able to be called passivation step.

This oxidation/passivation step enables a chemical oxide, the thickness, composition, and physical properties of which are controlled, to be made to grow at the surface of the amorphous and/or crystalline semiconductor material.

Formation of a native oxide introduces a too great variance in the initial state of the surfaces of the two materials.

The oxidation step can be performed with an oxygen plasma. The temperature of the substrate will advantageously be kept at a temperature of less than 200° C. during oxidation.

The surfaces of the layers of amorphous semiconductor material 1 and of crystalline semiconductor material 2 are preferentially oxidized by chemical means in a solution containing an oxidant of the semiconductor material. The solution is preferably aqueous.

Advantageously, oxidation by chemical means does not introduce any charge into the device, unlike oxidation with a plasma.

This neutrality is particularly sought for in sensitive structures, such as electronic devices.

The oxidation solution is a mixture of deionized water with one or more oxidants of the semiconductor material chosen from hydrogen peroxide, ammonia, sulphuric acid, hydrochloric acid, and ozone.

The solution is preferentially chosen from an SC-1 solution (mixture of water, $NH_4OH$ and $H_2O_2$), an SC-2 solution (mixture of water, HCl and $H_2O_2$), or an SPM solution (mixture of $H_2SO_4$ and $H_2O_2$).

The SPM solution is advantageously used at a temperature equal to 110° C. which may to go up to 200° C. ("Hot SPM").

Oxidation can also be obtained by a method of RCA type. This method consists in performing oxidation in an alkaline medium, for example with an SC-1 solution, followed by treatment in an acid medium, for example with an SC-2 solution.

According to another embodiment, the surfaces of the layers of amorphous semiconductor material 1 and crystalline semiconductor material 2 are oxidised with a solution containing ozone. This solution can for example be an aqueous solution with ozone bubbling.

The duration of the oxidation step is advantageously between 5 and 30 minutes.

Preferentially, the duration of the oxidation step is about 10 to 20 minutes.

Oxidation is advantageously performed at a temperature of less than 200° C.

Advantageously, oxidation at low temperature (less than or equal to 200° C.) does not modify the nature of the oxide layers formed, unlike oxidations called thermal oxidations where healing phenomena can be observed.

The nature and structure of the layers are advantageously not impaired and not modified, which enhances the selective etching of one layer with respect to the other.

The examples of the following table give different non-restrictive examples of solutions containing an oxidizing agent of the semiconductor material able to be used, along with the temperature and duration of the corresponding pre-treatment. The semiconductor material is in these examples silicon.

|  | Oxidation chemistry | | | | |
| --- | --- | --- | --- | --- | --- |
|  | SC-1 | SPM | SC-2 | RCA (SC-1 then SC-2) | Ozone |
| Temperature | 65° C. | 110° C. | 65° C. | 65° C. | 23° C. |
| Immersion time | 10 min | 10 min | 10 min | 10 min then 10 min | 10 min |

Application of a particular chemical surface treatment will enable a protective layer 3, 4 to be created at the surface of the layers of amorphous semiconductor material 1 and crystalline semiconductor material 2.

These protective layers 3, 4 protect semiconductor material layers 1, 2 against the subsequent etching step. What is meant by protect the layers is that these protective layers 3, 4 have to be removed in a first step to then be able to etch the underlying layers 1, 2.

The thicknesses of protective layers 3, 4 on the layers of amorphous material 1 and crystalline material 2 are comprised between 0.5 nm and 2 nm, and preferably the thicknesses of these layers are about 1 nm.

Advantageously, after the oxidation step and before the etching step, the wafer is cleaned.

The etching step (step c) is performed so as to selectively remove amorphous material layer 1.

The etching is preferentially an anisotropic etching.

The etching solution is a solution of ammonia, potassium hydroxide, sodium hydroxide, a tetramethylammonium hydroxide solution or a tetraethylammonium hydroxide solution.

Preferentially, the etching solution is a tetramethylammonium hydroxide solution or a tetraethylammonium hydroxide solution, the solutions being diluted between 2% and 25% by volume, and preferably between 5% and 25% by volume.

When the wafer is immersed in the etching solution, protective layer 3 on amorphous semiconductor material 1 is etched quicker than protective layer 4 on crystalline semiconductor material 2 (FIG. 2c), i.e. the oxide layer at the surface of amorphous material layer 1 dissolves quicker than the oxide layer at the surface of crystalline material layer 2.

Figure 2D:
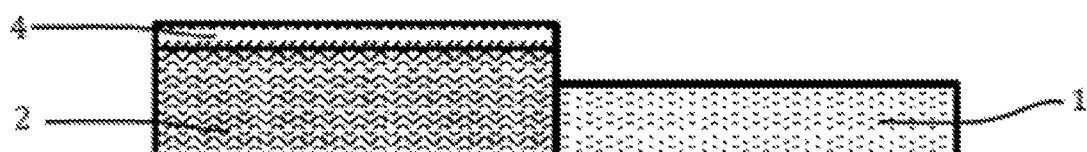
Figure 2E:
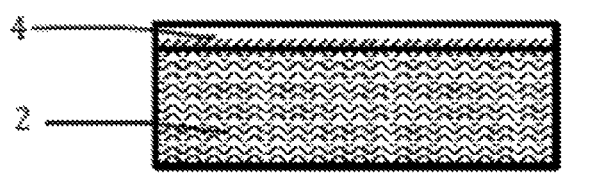

After the removal phase of protective layer 3 on the amorphous material, amorphous semiconductor material layer 1 is etched without the crystalline semiconductor material being impacted, so long as the latter is protected by a protective layer 4 (FIGS. 2d and 2e).

Figure 3:
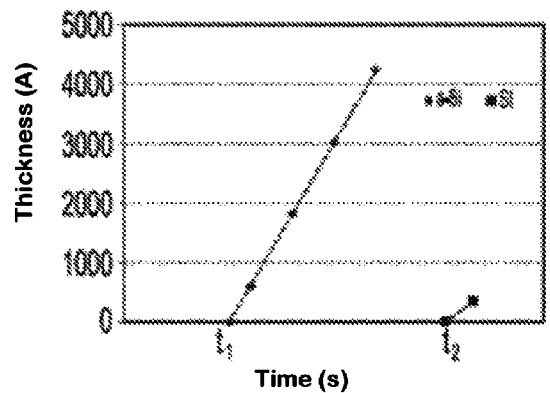
FIG. 3 represents a graph giving the thickness of amorphous silicon and the thickness of crystalline silicon etched versus time according to the method of the invention.

The graph of FIG. 3 represents the etching kinetics of amorphous silicon and crystalline silicon layers. The slopes of the curves were obtained for an oxidation of RCA type and for an etching with a TMAH solution at 25% heated to 35° C.

First protective layer 3 at the surface of amorphous silicon 1 is completely etched after a time $t_1$. For times longer than $t_1$, amorphous silicon layer 1, without its protection layer 3 and therefore accessible, is etched (straight line with rhombs of FIG. 3).

Second protective layer 4 at the surface of crystalline silicon 2 is completely etched after a time $t_2$. Crystalline silicon layer 2 starts to be etched for times longer than $t_2$ (straight line with squares of FIG. 3).

Protective layer 4 at the surface of crystalline silicon 2 has a lower etch rate than that of protective layer 3 at the surface of amorphous silicon 1, i.e. protective layer 4 at the surface of the crystalline silicon is more resistant to so etching and protects the crystalline silicon while the amorphous silicon is etched.

A time lag exists between the beginning of etching of the amorphous silicon layer $t_1$ and the beginning of etching of the crystalline silicon layer $t_2$.

This time lag can vary from 10 seconds to one hour, and advantageously from 10 s to 10 min, depending on the pre-treatment performed, the etching solution and the nature of the silicon. During this period comprised between $t_1$ and $t_2$, the selectivity is said to be maximal, as etching on the crystalline silicon is nil.

The difference $t_2-t_1$ is advantageously more than 10 seconds, and preferably more than 20 seconds, and even more preferentially more than 30 seconds.

Advantageously, the difference $t_2-t_1$ is less than 250 seconds, and preferably less than 60 seconds This time period leaves enough time to etch layers of amorphous semiconductor material having a thickness of 20 nm to 500 nm, preferably of 50 nm to 500 nm, and even more preferably of about 100 nm.

This method leads to protection of the crystalline silicon layer during a given time period which depends on the prior treatment.

The etching step is advantageously performed at a temperature comprised between 20° C. and 100° C., and preferably between 50° C. and 90° C. in order to have a sufficiently long selectivity window to etch all of the amorphous material without etching the crystalline material, while at the same time remaining within an industrially applicable time scale.

The method will now be described by means of the following examples given for illustrative and non-restrictive example purposes.

Figure 4A:
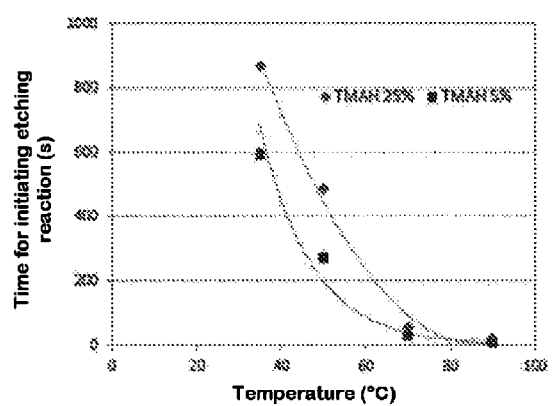
FIGS. 4a and 4b represent graphs giving the time necessary for initiating etching, in solutions of TMAH diluted at 5% and 25%, for a) crystalline silicon and b) amorphous silicon oxidised in a RCA solution, versus the temperature of the etching solution.
Figure 4B:
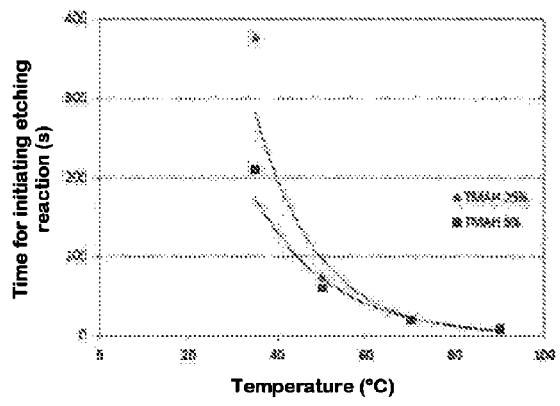

FIGS. 4a and 4b represent the initiation times of etchings of a crystalline silicon layer (FIG. 4a: initiation time $t_2$) and of an amorphous silicon layer (FIG. 4b: Initiation time $t_1$), after oxidation, versus temperature.

Oxidation of the silicon layers was performed with the RCA method.

Etching is performed in a TMAH solution diluted 5% or 25%, at temperatures comprised between 30 and 90° C.

The more the temperature increases, the shorter the initiation times. The TMAH solution diluted 5% presents a lower initiation time than that obtained for a TMAH solution diluted 25%.

Figure 5:
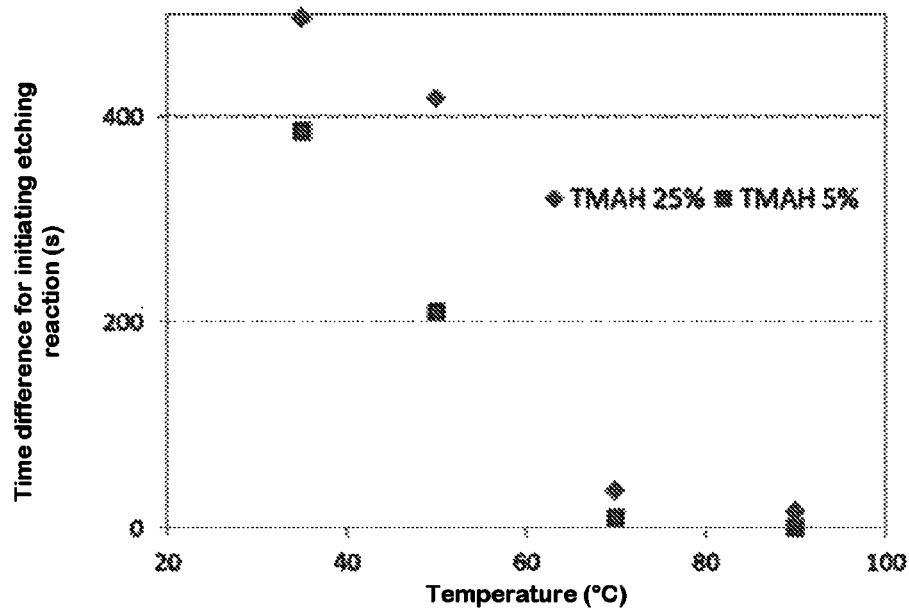
FIG. 5 represents a graph giving the time difference required for initiation of etching between amorphous silicon and crystalline silicon oxidised with a RCA solution and etched with TMAH at 5% or 25%, for temperatures comprised between 30 and 90° C., according to the method of the invention.

The time differentials or delta $t_2-t_1$ are represented versus the temperature in FIG. 5.

According to the selected parameters (temperature, concentration of the alkaline etching solution), the differential $t_2-t_1$ can range from 0 s to 500 s. A selectivity window of 500 s is obtained for a temperature of 35° C. and a TMAH solution diluted 25%.

With a selectivity window of 500 s, and as the etch rate of amorphous silicon is about 20 Å/s (i.e. 2 nm/s), it is possible to etch 1 µm of amorphous silicon without consuming any crystalline silicon.

Thus, to selectively etch a layer of amorphous silicon of about 100 nm with a TMAH solution diluted 25% and heated to 35° C., a selectivity window of 50 s will be sufficient. With an RCA chemical passivation, an exposure time of 3 min30 will be sufficient to totally etch the layer of amorphous Si without etching any crystalline silicon.

Figure 6:
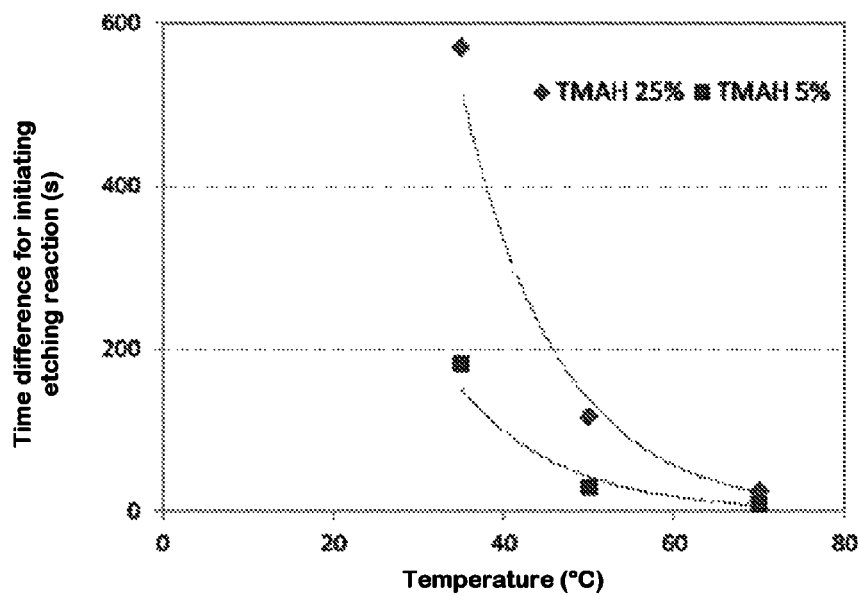
FIG. 6 represents a graph giving the time difference required for initiation of etching between amorphous silicon and crystalline silicon oxidised with a Caro's solution and etched with TMAH at 5% or 25%, for temperatures comprised between 30 and 90° C., according to the method of the invention.

The time differentials $t_2-t_1$, for a chemical oxidation in a Caro's solution and etching in TMAH solutions diluted 5% or 25%, are represented versus the temperature in FIG. 6.

According to the parameters chosen, the differential $t_2-t_1$, can range from 0 s to 570 s.

With a selectivity window of 570 s, it is possible to etch more than 1 µm of amorphous silicon with a TMAH solution diluted 25% and heated to 35° C. without consuming any crystalline silicon.

In the case of this pre-treatment, an exposure time to a TMAH chemistry diluted 25% and heated to 70° C. of less than 1 min 30 s will be sufficient to totally etch a layer of 100 nm of amorphous Si without etching any crystalline silicon.

Similar results were obtained with TEAH.

The different embodiments described in the foregoing concern the configuration where the protective layer at the surface of the crystalline semiconductor material layer presents a better resistance to etching than the protective layer at the surface of the amorphous semiconductor material layer.

However, it is also possible to perform a specific surface preparation enabling the crystalline semiconductor material to be selectively etched. The amorphous semiconductor material will not be etched. In this case, the process window is very short. What is meant by very short is that it extends from 1 s to 30 s. It is less than 20 s, and more particularly the window is between 3 s and 20 s.

For example, for selective etching of the crystalline semiconductor material, the method for performing selective etching of a semiconductor material in solution comprises the following successive steps:
a') providing a substrate comprising a layer of amorphous semiconductor material 1 and a layer of crystalline semiconductor material 2 to be etched,
b') applying a chemical treatment on the surface of the layers of amorphous semiconductor material 1 and crystalline semiconductor material 2 so as to form a first protective layer 3 at the surface of amorphous semiconductor material 1 and a second protective layer 4 at the surface of crystalline semiconductor material 2,
c') etching second protective layer 4 and crystalline semiconductor material layer 2 with an etching solution, the etch rate $v_1$ of first protective layer 3 being lower than the etch rate $v_2$ of second protective layer 4.

The etching time is adjusted so as to totally etch crystalline semiconductor material layer 2 without etching amorphous semiconductor material layer 1.

The chemical treatment is a passivation step by chemical means. It is advantageously performed with a hydrofluoric acid solution.

The etching time will be chosen so as not to etch the amorphous semiconductor material layer in order not to modify its roughness.

The etching solution is an alkaline solution, for example of TMAH or TEAH type.

It is possible for the person skilled in the art to choose different surface preparations to select which layer will be selectively etched with respect to the other, and in which thickness range.

The method can be entirely performed at temperatures of less than 200° C., or even less than 100° C. depending on the oxidation/passivation chemistry.

The method is also very fast, as in less than 30 minutes, or even less than 15 minutes, it is possible not only to oxidize but also to selectively etch the semiconductor material layer that is to be removed.

The method can be used for numerous applications.

This may for example involve selectively etching an amorphous silicon layer that has been deposited and not recrystallized following thickening of source/drain areas in a CMOS transistor. In particular, this method is particularly relevant for fabrication technologies called cold or low-temperature technologies.

It may further involve selective etching of areas where the silicon has been mechanically hardened, as in the case of nano-imprinting or of selective removal of the amorphized areas by use of a laser to anneal or activate the so dopants in the silicon.

The invention claimed is:

1. Method for performing selective etching of a semiconductor material in solution comprising the following successive steps:
    a) providing a substrate comprising a layer of amorphous semiconductor material to be etched and a layer of crystalline semiconductor material,
    b) oxidizing the surfaces of the layers of amorphous semiconductor material and of crystalline semiconductor material so as to form a first protective layer at the surface of the amorphous semiconductor material and a second protective layer at the surface of the crystalline semiconductor material,
    c) etching the first protective layer and the layer of amorphous semiconductor material with an alkaline etching solution, the etch rate $v_1$ of the first protective layer being higher than the etch rate $v_2$ of the second protective layer.

2. Method according to claim 1, wherein the etch time is adjusted so as to totally etch the amorphous semiconductor material layer without etching the crystalline semiconductor material layer.

3. Method according to claim 1, wherein the surfaces of the amorphous semiconductor material and crystalline semiconductor material layers are oxidized by chemical means in a solution containing an oxidant of the semiconductor material.

4. Method according to claim 3, wherein the oxidation solution is a mixture of water with one or more oxidants of the semiconductor material chosen from hydrogen peroxide, ammonia, sulphuric acid, hydrochloric acid, and ozone.

5. Method according to claim 4, wherein the oxidation solution is a hydrochloric acid solution, a mixture of $NH_4OH$ and $H_2O_2$, a mixture of HCl and $H_2O_2$, a mixture of $H_2SO_4$ and $H_2O_2$, or a solution containing ozone.

6. Method according to claim 3, wherein oxidation by chemical means consists in performing a first oxidation in an alkaline medium followed by a second oxidation in an acid medium.

7. Method according to claim 1, wherein the surfaces of the amorphous semiconductor material and crystalline semiconductor material layers are oxidized with an oxygen plasma.

8. Method according to claim 1, wherein oxidation is performed at a temperature lower than or equal to 200° C.

9. Method according to claim 1, wherein the etching solution is an ammonia, potassium hydroxide, or sodium hydroxide solution, a tetramethylammonium hydroxide solution or a tetraethylammonium hydroxide solution.

10. Method according to claim 9, wherein the etching solution is a tetramethylammonium hydroxide solution or a tetraethylammonium hydroxide solution, the solutions being diluted between 2% and 25% by volume.

11. Method according to claim 1, wherein the etching is performed at a temperature comprised between 20° C. and 100° C.

12. Method according to claim 11, where in the etching is performed at a temperature comprised between 50° C. and 90° C.

13. Method according to claim 1, wherein the semiconductor material is silicon or a SiGe alloy.

14. Method according to claim 1, wherein the crystalline material is monocrystalline or polycrystalline.

15. Method according to claim 1, wherein the thicknesses of the protective layers are comprised between 0.5 nm and 2 nm.

16. Method according to claim 15, wherein the thicknesses of the protective layers are about 1 nm.

17. Method according to claim 1, wherein the amorphous semiconductor material layer has a thickness of 50 nm to 500 nm.

18. Method according to claim 17, wherein the amorphous semiconductor material layer has a thickness of about 100 nm.

19. Method according to claim 1, wherein the first protective layer at the surface of the amorphous semiconductor material is completely etched after a time $t_1$, and the second protective layer at the surface of the crystalline semiconductor material is completely etched after a time $t_2$, the difference $t_2-t_1$ being more than 20 seconds.

20. Method according to claim 1, wherein the first protective layer at the surface of the amorphous semiconductor material is completely etched after a time $t_1$, and the second protective layer at the surface of the crystalline semiconductor material is completely etched after a time $t_2$, the difference $t_2-t_1$ being less than 250 seconds.

21. Method for performing selective etching of a semiconductor material in solution comprising the following successive steps:
  a') providing a substrate comprising a layer of amorphous semiconductor material and a layer of crystalline semiconductor material to be etched,
  b') applying a chemical treatment on the surfaces of the layers of amorphous semiconductor material and of crystalline semiconductor material so as to form a first protective layer at the surface of the amorphous semiconductor material and a second protective layer at the surface of the crystalline semiconductor material,
  c') etching the second protective layer and the layer of crystalline semiconductor material with an etching solution, the etch rate $v_1$ of the first protective layer being lower than the etch rate $v_2$ of the second protective layer.

22. Method according to claim 21, wherein the etch time is adjusted to totally etch the crystalline semiconductor material layer without etching the amorphous semiconductor material layer.

23. Method according to claim 21, wherein the chemical treatment is performed in a hydrofluoric acid solution.

\* \* \* \* \*